United States Patent [19]

Weiss

[11] 4,245,135
[45] Jan. 13, 1981

[54] BUS BAR FOR A CARD FRAME FOR CIRCUIT CARDS

[75] Inventor: Harald Weiss, Bremen, Fed. Rep. of Germany

[73] Assignee: Vero Electronics GmbH, Bremen, Fed. Rep. of Germany

[21] Appl. No.: 29,339

[22] Filed: Apr. 12, 1979

[30] Foreign Application Priority Data

May 18, 1978 [DE] Fed. Rep. of Germany ... 7811665[U]

[51] Int. Cl.³ .............................................. H02G 3/04
[52] U.S. Cl. .................................. 174/72 B; 174/101
[58] Field of Search ..................... 174/101, 72 B, 68 B

[56] References Cited

U.S. PATENT DOCUMENTS 3,968,322   7/1976   Taylor ................................. 174/101

FOREIGN PATENT DOCUMENTS 7311339 10/1974 Netherlands .......................... 174/72 B Primary Examiner—Roy N. Envall, Jr.
Attorney, Agent, or Firm—Watson, Cole, Grindle & Watson

[57] ABSTRACT

A bus bar for a card frame for receiving circuit cards comprises a one-piece electrically insulating housing having a recess of U-section, a stack of insulating strips separated by insulating foils disposed within the recess with one strip in contact with the base of the recess, a cover member clipped to the open end of the housing and a pad of resilient material disposed between the cover member and the stack.

3 Claims, 2 Drawing Figures

BUS BAR FOR A CARD FRAME FOR CIRCUIT CARDS

In British Specification No. 1528443 I have described a bus bar for a card frame for receiving circuit cards comprising a carrier having a recess of U-section, an electrically insulated housing press fitted into the recess and having side walls which are relatively movable, and a plurality of electrically conducting strips separated by electrically insulating foils, the strips being disposed side by side within the housing, extending in planes parallel to the side walls of the housing and being held in the housing by lateral pressure from the housing.

Such a bus bar is assembled by assembling the strips and intervening foils within the housing and then press fitting the resulting package into the recess in the carrier. After assembly the strips and foils are held together by uniform and continuing lateral pressure and relative movement of the side walls of the housing enables them to exert such pressure notwithstanding dimensional tolerances in the assembly.

The tolerances so permitted are, however, small and the object of the invention is to provide an alternative form of bus bar, which permits greater dimensional tolerances and nevertheless ensures that the strips and intervening foils will be held together under pressure within the bus bar.

SUMMARY OF THE INVENTION

The invention accordingly provides a bus bar for a card frame for receiving circuit cards, said bus bar comprising a one-piece electrically insulating housing having a recess of U-section, a stack of electrically conducting strips separated by insulating foils and disposed in face contact with one another within the housing with the strips extending parallel to the base of the recess, a cover member clipped to the open end of the housing and a pad of resilient material disposed in the recess between the stack and the cover member and serving to maintain the stack in compression within the housing.

The resilient pad serves not only to maintain the stack of strips and foils under pressure but also to absorb significant dimensional tolerances in the assembly. If desired the stack can be removed from the housing and exchanged for another by unclipping the cover member.

As is conventional in bus bars of the kind in question, each strip carries an input terminal, to which a suitable input voltage is applied in use, and a number of wiring posts to which desired electrical connections are made by wire wrapping. Conveniently the input terminals and the wiring posts extend through slots in the base of the housing and the wiring posts may be cranked so as to provide alignment of the posts in at least one row.

BRIEF DESCRIPTION OF THE DRAWINGS

One embodiment of the invention will now be described with reference to the accompanying drawing, in which.

DETAILED DESCRIPTION

Figure 1:
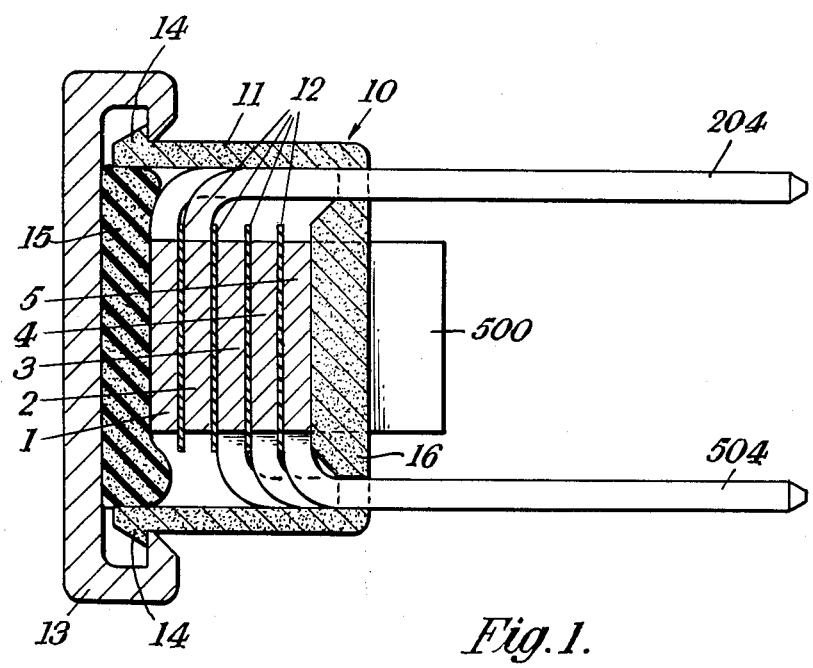
FIG. 1 is a cross-section showing the bus bar.
Figure 2:
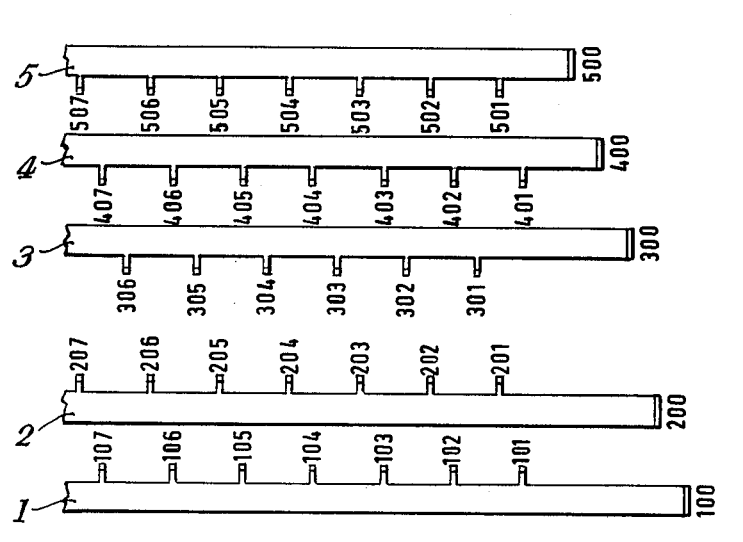
FIG. 2 is a diagrammatic view showing the individual conducting strips.

The bus bar 10 shown in the drawing includes a U-shaped housing 11 of insulating material, containing within its cavity a stack of electrically conducting strips 1, 2, 3, 4 and 5 separated by self-adhesive insulating foils 12, the strips lying flat and parallel to the base of the recess in the housing. A cover member 13, which is attached in use to a card frame (not shown), is clipped over lips 14 at the open end of the housing to press the side walls of the housing together. A pad 15 of resilient material, interposed between the cover member 13 and the strip 1, holds the stack of strips and the interposed foils under compression within the cavity in the housing 11.

The strips 1–5 carry input terminals 100–500 respectively, which project through slots in the base 16 as shown in FIG. 1, and wiring posts, 101, 102—; 201,202—; 301,302—; 401,402—; and 501,502—; which also extend through slots in the base 16. The wiring posts are cranked so that they extend from the base 16 in two aligned rows. The external surface of the base 16 carries, as in the case of the bus bar described in British Specification No. 1528443, indicia, corresponding to the numbering of the input terminals and winding posts, which indicate to the operator engaged in wiring the particular conducting strips to which the input terminals and posts are allotted.

What I claim as my invention and desire to secure by Letters Patent is:

1. A bus bar for a card frame for receiving circuit cards, said bus bar comprising a one-piece electrically insulating housing, having a recess of U-section, a stack of electrically conducting strips separated by insulating foils and disposed in face contact with one another within the housing with the strips extending parallel to the base of the recess, a cover member clipped to the open end of the housing and a pad of resilient material disposed in the recess between the stack and the cover member and serving to maintain the stack in compression within the housing.

2. A bus bar according to claim 1, wherein the strips are formed with wiring posts and with input terminals which extend through apertures in the base of the housing.

3. A bus bar according to claim 2, wherein the wiring posts are cranked to provide alignment of the posts in at least one row.

* * * * *